US007683671B2

(12) United States Patent
Lee

(10) Patent No.: US 7,683,671 B2
(45) Date of Patent: Mar. 23, 2010

(54) METHOD, APPARATUS, AND SYSTEM PROVIDING POWER SUPPLY INDEPENDENT IMAGER OUTPUT DRIVER HAVING A CONSTANT SLEW RATE

(75) Inventor: Yan Lee, Surrey (GB)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/512,301

(22) Filed: Aug. 30, 2006

(65) Prior Publication Data

US 2008/0061830 A1 Mar. 13, 2008

(30) Foreign Application Priority Data

Aug. 24, 2006 (GB) .................................. 0616813.2

(51) Int. Cl.
*H03K 19/094* (2006.01)
*H03K 19/0175* (2006.01)
*H03K 5/12* (2006.01)

(52) U.S. Cl. ........................... 326/83; 327/112; 327/170

(58) Field of Classification Search ................... 326/68, 326/80, 82, 83, 86, 87, 112, 115, 126, 127; 327/108, 109
See application file for complete search history.

(56) References Cited

U.S. PATENT DOCUMENTS

| 6,140,630 | A | 10/2000 | Rhodes |
| 6,204,524 | B1 | 3/2001 | Rhodes |
| 6,236,248 | B1 * | 5/2001 | Koga ........................... 327/112 |
| 6,310,366 | B1 | 10/2001 | Rhodes et al. |
| 6,326,652 | B1 | 12/2001 | Rhodes |
| 6,333,205 | B1 | 12/2001 | Rhodes |
| 6,359,484 | B1 * | 3/2002 | Ajit ............................. 327/170 |
| 6,376,868 | B1 | 4/2002 | Rhodes |
| 2002/0149401 | A1 * | 10/2002 | Hall et al. .................... 327/108 |
| 2005/0110531 | A1 * | 5/2005 | Okamoto et al. ............ 327/112 |
| 2005/0162191 | A1 * | 7/2005 | Vorenkamp .................. 326/88 |

* cited by examiner

*Primary Examiner*—Vibol Tan
*Assistant Examiner*—Dylan White
(74) *Attorney, Agent, or Firm*—Dickstein Shapiro LLP

(57) ABSTRACT

An output driver having an output that is not dependant on the variation of the voltage level of a variable supply voltage. The output driver, having at least two power supply voltages and which is not influenced by the variation of the voltage level of a variable power supply, leads to a constant output slew rate.

18 Claims, 5 Drawing Sheets

METHOD, APPARATUS, AND SYSTEM PROVIDING POWER SUPPLY INDEPENDENT IMAGER OUTPUT DRIVER HAVING A CONSTANT SLEW RATE

FIELD OF THE INVENTION

Embodiments of the invention relate generally to signal output drivers.

BACKGROUND OF THE INVENTION

Imaging devices, including charge coupled devices (CCD) and complementary metal oxide semiconductor (CMOS) imagers, are commonly used in photo-imaging applications.

A CMOS imager circuit includes a focal plane array of pixels, each of the pixels including a photosensor, for example, a photogate, photoconductor or a photodiode for accumulating photo-generated charge a portion of the substrate. Each pixel has a charge storage region, formed on or in the substrate, which is connected to the gate of an output transistor that is part of a readout circuit. The charge storage region may be constructed as a floating diffusion region. In some imager circuits, each pixel may include at least one electronic device such as a transistor for transferring charge from the photosensor to the storage region and one device, also typically a transistor, for resetting the storage region to a predetermined charge level prior to charge transference.

In a CMOS imager, the active elements of a pixel perform the necessary functions of: (1) photon to charge conversion; (2) accumulation of image charge; (3) resetting the storage region to a known state; (4) transfer of charge to the storage region; (5) selection of a pixel for readout; and (6) output and amplification of a signal representing pixel charge. Photo charge may be amplified when it moves from the initial charge accumulation region to the storage region. The charge at the storage region is typically converted to a pixel output voltage by a source follower output transistor.

CMOS imagers of the type discussed above are generally known as discussed, for example, in U.S. Pat. No. 6,140,630, U.S. Pat. No. 6,376,868, U.S. Pat. No. 6,310,366, U.S. Pat. No. 6,326,652, U.S. Pat. No. 6,204,524 and U.S. Pat. No. 6,333,205, assigned to Micron Technology, Inc., which are hereby incorporated by reference in their entirety.

In CMOS and other imagers and in other lower power integrated circuit applications, it is common to have multiple power domains to fulfill power and performance requirements. A dual power supply strategy is often employed in output drivers. This dual power supply approach provides high output driving capability and a good interface with core logic.

FIG. 1 illustrates an output driver circuit 100, which may be used in integrated circuit applications, for example, within the peripheral logic circuit of a CMOS imager. The circuit 100 comprises a PMOS transistor P100, NMOS transistor N100 connected in series with transistor P100, reset switches S100, S102, capacitors $C_P$ and $C_N$ and resistors $R_P$, $R_N$. The input into the circuit 100 is at node A and the output from the circuit 100 is at node Z. As can been seen in FIG. 1, the circuit 100 employs an RC time constant circuit to control the rise and fall of the signals that activate the gates of the of the NMOS and PMOS transistors N100, P100. The NMOS transistor N100 rising output slew rate is determined by the values of resistor $R_N$ and capacitor $C_N$ which are connected across the input node A and the output node Z. The gate of transistor N100 is connected to the node between resistor $R_N$ and capacitor $C_N$ and to switch S102, which is also connected to ground GND. Similarly, the PMOS transistor P100 rising output slew rate is determined by the values of series connected resistor $R_P$ and capacitor $C_P$ likewise connected across the input node A and output node Z. The gate of transistor P100 is connected to the node between $R_P$ and capacitor $C_P$ and to switch S100, which is also connected to the power supply VDDIO. The output drive strength and the slew rate of either transistor P100, N100 ultimately depends on the variation of the power supply VDDIO voltage.

In order to make an output driver (e.g., driver circuit 100) applicable to a variety of applications, the IO power supply VDDIO of the output driver requires a wide operating range; that is, there may be a wide variation in the voltage level of power supply VDDIO. As a result, the output driver has a large variation in both drive strength and slew rate depending on the value of power supply VDDIO. In addition, higher supply voltages lead to poor simultaneous switching output (SSO) performance. This, in turn, typically requires thicker metal tracks and more power supply pads in order to compensate for the poor SSO performance. Accordingly, there is a need and a desire for an output driver that provides a more constant output drive and slew rate for a given load which in turn leads to better SSO performance.

DETAILED DESCRIPTION OF THE INVENTION

In the following detailed description, reference is made to the accompanying drawings, which form a part hereof and show by way of illustration specific embodiments in which the invention may be practiced. These embodiments are described in sufficient detail to enable those skilled in the art to practice them, and it is to be understood that other embodiments may be utilized, and that structural, logical, and electrical changes may be made.

To achieve a constant output drive and slew rate for a given load, it is necessary to control the gate-to-source voltage applied to the output driver PMOS and NMOS transistors. This, in turn, controls the output slew rate. The embodiments of the output driver described herein provide an improved constant output drive and slew rate. The embodiments may be used in imaging applications, including e.g., the output driver of the image processor for an imager.

Figure 1:
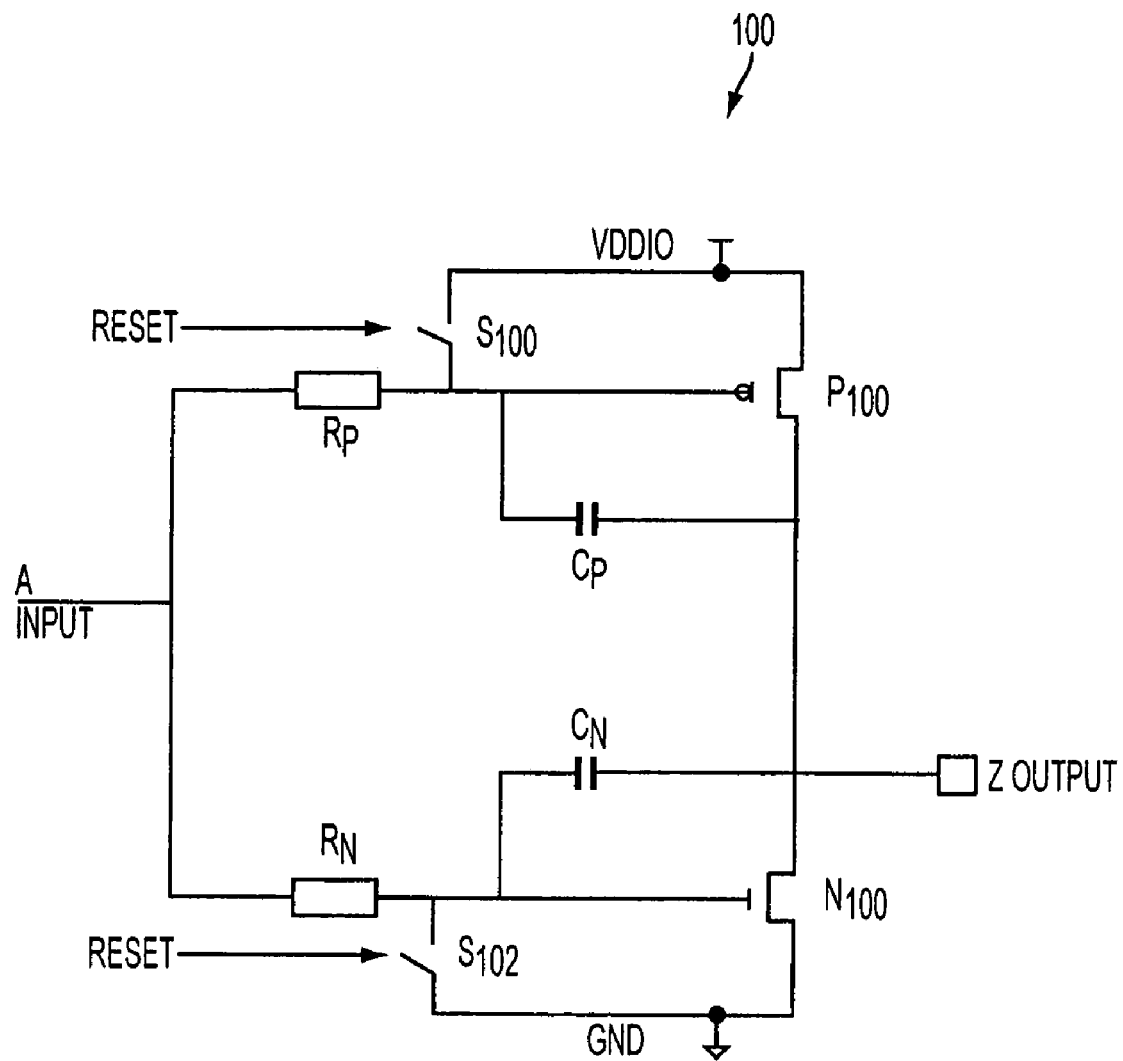
FIG. 1 illustrates a known CMOS output driver.
Figure 2:
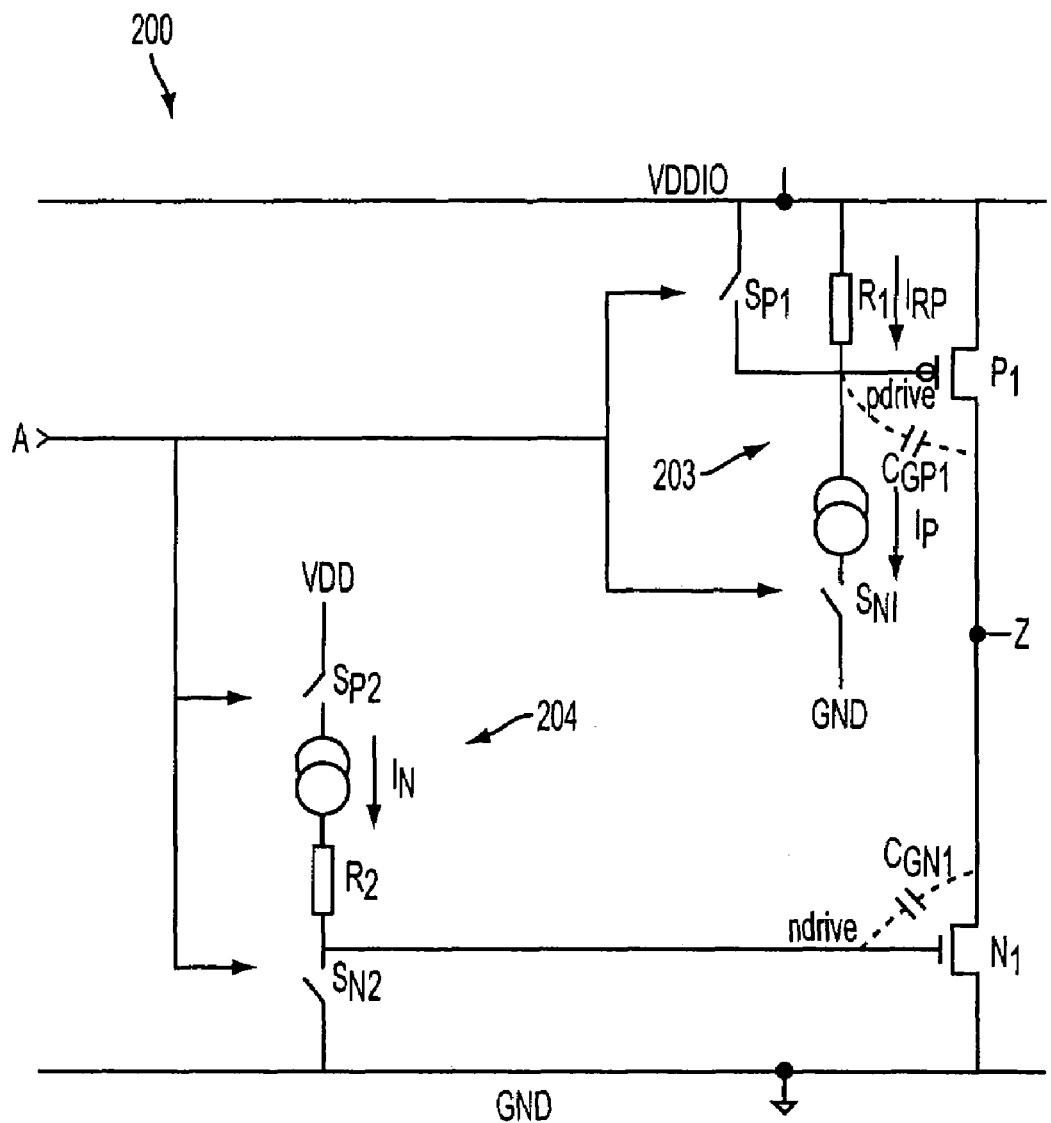
FIG. 2 illustrates one embodiment of a power supply independent output driver.
Figure 3:
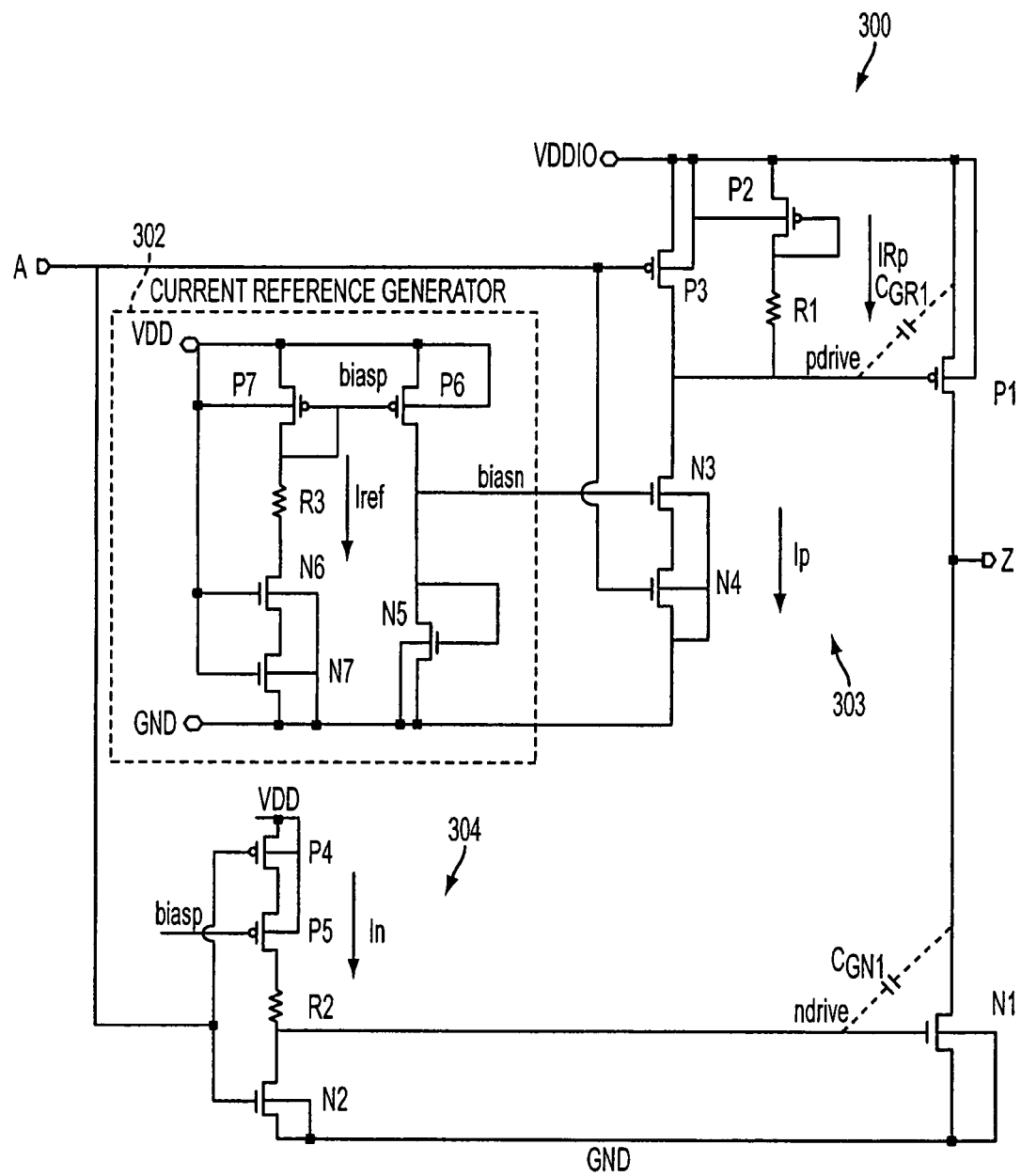
FIG. 3 illustrates in more detail a circuit implementation of the FIG. 2 embodiment.

The circuit conceptually illustrated in FIG. 2, and more fully illustrated in FIG. 3, is an output driver having an output at node Z which is not influenced by the variation in the voltage level of power supply VDDIO. This embodiment has at least two control circuits 203, 204 (303 and 304 in FIG. 3) which operate to drive the output transistors P1 and N1 such that the voltage level variation of power supply VDDIO does not influence the output at node Z of the circuit 200, 300. Although the circuit is described only with reference to FIG. 2, this description is applicable to FIG. 3. This functionality is implemented by a first control circuit 203, in conjunction with a second control circuit 204, which is configured such that the voltage supplied to output transistor P1 is based on a first resistance $R_1$ and current $I_{R_P}$ and is not dependant on the voltage level of the power supply VDDIO. The second control circuit 204 is configured to supply an operating voltage based on constant power supply VDD which is connected in series with constant current source $I_N$ and resistance $R_2$. Accordingly, the first and second control circuits 203, 204 are configured to operate output transistors P1 and N1 such that the output signal at node Z is not influenced by the variation in the voltage level of power supply VDDIO.

When the input at node A is at ground GND, the first control circuit is connected to power supply VDDIO and the second control circuit 203 is connected to power supply VDD. The voltage of output transistor P1 is at VDDIO and the transistor P1 is turned off. The gate voltage of output transistor N1 starts at a voltage set by the second control circuit 204. The output transistor N1 is on, which pulls the voltage of the output at node Z to ground GND.

When the input at node A rises from ground GND to VDDIO, output transistor N1 is turned off and output transistor P1 is turned on. The gate voltage of output transistor P1 is controlled by the first control circuit 203 and the output signal at Z is based on a first resistance $R_1$ and the current $I_{Rp}$ of the first control circuit 203.

As the input at node A switches from VDDIO to ground GND, output transistor P1 is turn off and output transistor N1 is turned on, and the circuit operates as described above.

FIG. 2 illustrates a conceptual schematic drawing of one embodiment of an output driver circuit 200. The illustrated output driver circuit 200 comprises output driver transistors P1 and N1, constant current sources $I_P$ and $I_N$, current sensing resistor $R_1$, current limiting resistor $R_2$ and four switches $S_{P1}$, $S_{P2}$, $S_{N1}$, $S_{N2}$. The output driver circuit 200 is powered by two power supplies VDDIO and VDD having representative supply voltages. VDDIO is the main supply to the output stage of the circuit 200, formed by serially connected output transistors P1 and N1, and has a relatively large voltage operating range (e.g., an operating range of about 1.7 volts to about 3.6 volts). VDD is a constant power supply which may be the main power supply for logic circuits of an integrated circuit such as for example, an imager integrated circuit. Current sensing resistor $R_1$, and switch $S_{P1}$ are connected in parallel between VDDIO and node pdrive. The gate of transistor P1 is also connected to node pdrive.

Switches $S_{N1}$ and $S_{P1}$ are controlled by a signal on input node A. The node pdrive is also connected to current source $I_P$ which is serially connected with switch $S_{N1}$, which is also connected to ground GND. Switch $S_{P2}$ is connected between VDD and constant current source $I_N$.

Constant current source $I_N$ is connected between switch $S_{P2}$ and resistor $R_2$. Resistor $R_2$ is also serially connected to switch $S_{N2}$. The node between switch $S_{N2}$ and resistor $R_2$ connects to the gate of output transistor N1 as node ndrive. Switches $S_{P2}$, $S_{N2}$ are controlled by the signal at input node A.

Initially, the input at node A is at ground GND causing switches $S_{P1}$ and $S_{P2}$ to be on and switches $S_{N1}$ and $S_{N2}$ to be off. When a switch is described as off, the switch is open and when a switch is described as on, the switch is closed. The gate of output transistor P1 is at VDDIO and the gate of output transistor N1 is at a voltage set by VDD, current source $I_N$ and the resistance of resistor $R_2$. Output transistor N1 is on which forces the output at node Z to ground GND while output transistor P1 is off.

When the input at node A switches from ground GND to VDDIO, switches $S_{P1}$ and $S_{P2}$ turn off and switches $S_{N1}$ and $S_{N2}$ turn on. Output transistor N1 is turned off as the gate is now coupled to ground through switch $S_{N2}$. Output transistor P1 initially is off and the gate voltage of output transistor P1 is VDDIO. Constant current source $I_P$ conducts current through switch $S_{N1}$ and current $I_{Rp}$ flows through the sensing resistor $R_1$ creating a potential across the resistor $R_1$. Since node pdrive is pulled down, output transistor P1 is turned on and the output at node Z rises towards VDDIO. When $I_P$ is equal to $I_{Rp}$, the gate voltage of output transistor P1 is equal to $I_{Rp}*R_1$. This is independent of the voltage level of power supply VDDIO. The voltage slope at the gate of the output transistor P1, which controls the output rising slew rate, is determined by the values of $I_{Rp}$, $R_1$ and $C_{GP1}$ (capacitance of the gate of output transistor P1) that function to provide output a voltage that is independent of the variation of the voltage level of power supply VDDIO.

When the input at node A switches from VDDIO to ground GND, switches $S_{P1}$ and $S_{P2}$ are turned on and switches $S_{N1}$ and $S_{N2}$ are turned off. Output transistor P1 is turned off and the constant current source $I_N$ flows to and pulls the gate of the output transistor N1 towards VDD. Output transistor N1 is turned on and forces the output at node Z to ground GND. With VDD constant, the gate of output transistor N1 is also constant and independent of VDDIO. The falling slew rate of output transistor N1 is dependent on the values of $I_N$, $R_2$ and $C_{GN1}$ (the gate capacitance of output transistor N1).

FIG. 3 illustrates an electrical schematic of one embodiment of an output driver circuit 300 which implements the conceptual circuit 200 illustrated in FIG. 2. The output driver circuit 300, which includes a current reference generator 302, comprises seven PMOS transistors P1-P7, seven NMOS transistors N1-N7 and three resistors R1-R3. The circuit 300 is supplied by two power supplies VDDIO and VDD. VDDIO is the main supply to the output stage of the circuit 300, output transistors P1 and N1, and has a relatively a large voltage operating range. VDD which is a constant core power supply, for example, this may be the main power supply that supplies power for logic circuits of an integrated circuit. Transistors P3, P4, N2, and N4 are switches and transistors P5 and N3 provide constant current sources. Switch P3 corresponds to switch $S_{P1}$ of FIG. 2; switch P4 corresponds to $S_{P2}$ of FIG. 2; switch N2 corresponds to $S_{N2}$ of FIG. 2; and switch N4 corresponds to switch SN1 of FIG. 2.

Initially, the input at node A is at a ground potential GND and switches P3 and P4 are on while switches N2 and N4 are off. The gate of output transistor P1 is set to VDDIO and the gate of output transistor N1 is at VDD. With the output transistor N1 in a conducting state, the output at node Z is pulled towards ground GND.

When the input at node A is switched from ground GND to VDDIO, switches P3 and P4 are turned off, while switches N2 and N4 are turned on. Constant current source N3 conducts and the gate of the output transistor P1 is pulled towards ground GND. Current $I_{Rp}$ flows through the sensing resistor $R_1$ and a potential develops across it. Output transistor P1 is turned on and the output at node Z rises towards VDDIO. When current source $I_P$ is equal to current source $I_{Rp}$, the gate voltage of output transistor P1 is based on transistor P2 and current sensing resistor $R_1$ and is independent of VDDIO. The voltage slope at the gate of the output transistor P1, which controls the output rising slew rate, is determined by the values of $I_{Rp}$, $R_1$ and $C_{GP1}$ (capacitance of the gate of output transistor P1) that function to provide output a voltage that is independent of voltage variations of VDDIO.

When the input at node A switches from VDDIO to ground GND, switches P3 and P4 are turned on, while switches N2 and N4 are turned off. Output transistor P1 is turned off and constant current source P5 is turned on and pulls the gate of output transistor N1 towards VDD. Output transistor N1 is turned on and forces the output at node Z to ground GND. Output transistor P1 is turned off. With VDD constant, the gate drive of output transistor N1 is also constant and independent of VDDIO. The falling slew rate of output transistor N1 is dependent on the values of $I_N$, $R_2$ and $C_{GN1}$ (the gate capacitance of output N1).

The current reference generator 302 supplies bias voltages biasn and biasp to respective gates of current generating transistors N3 and P5. Current reference generator 302 includes PMOS transistors P6 and P7, NMOS transistors N5-N7 and resistor $R_3$. Reference current $I_{REF}$ is defined by PMOS transistor P7, resistor R3, and NMOS transistors N6 and N7. The circuit 300 is designed such that constant current source $I_P$ is approximately equal to the reference current $I_{REF}$. Accordingly, transistors N6 and N7 are selected to have properties similar to switches N3 and N4. This circuit arrangement allows for transistors N6 and N7 to cancel out any error voltage developed across these switches N3 and N4. By making transistor P2 and resistor $R_1$ have similar properties as transistor P7 and resistor R3, the voltage developed across VDDIO and the gate of output transistor P1 is approximately equal to VDD. Due to the similar properties of transistors P5 and P7, current source $I_N$ is a mirror of the reference current $I_{REF}$.

The circuits 200, 300 illustrated in FIGS. 2-3 illustrate output drivers which are not influenced by the variation in a power supply voltage level (e.g., VDDIO). This, in turn, leads to a constant slew rate. Additionally, the power level supply independence of the output driver leads to improved SSO performance.

Figure 4:
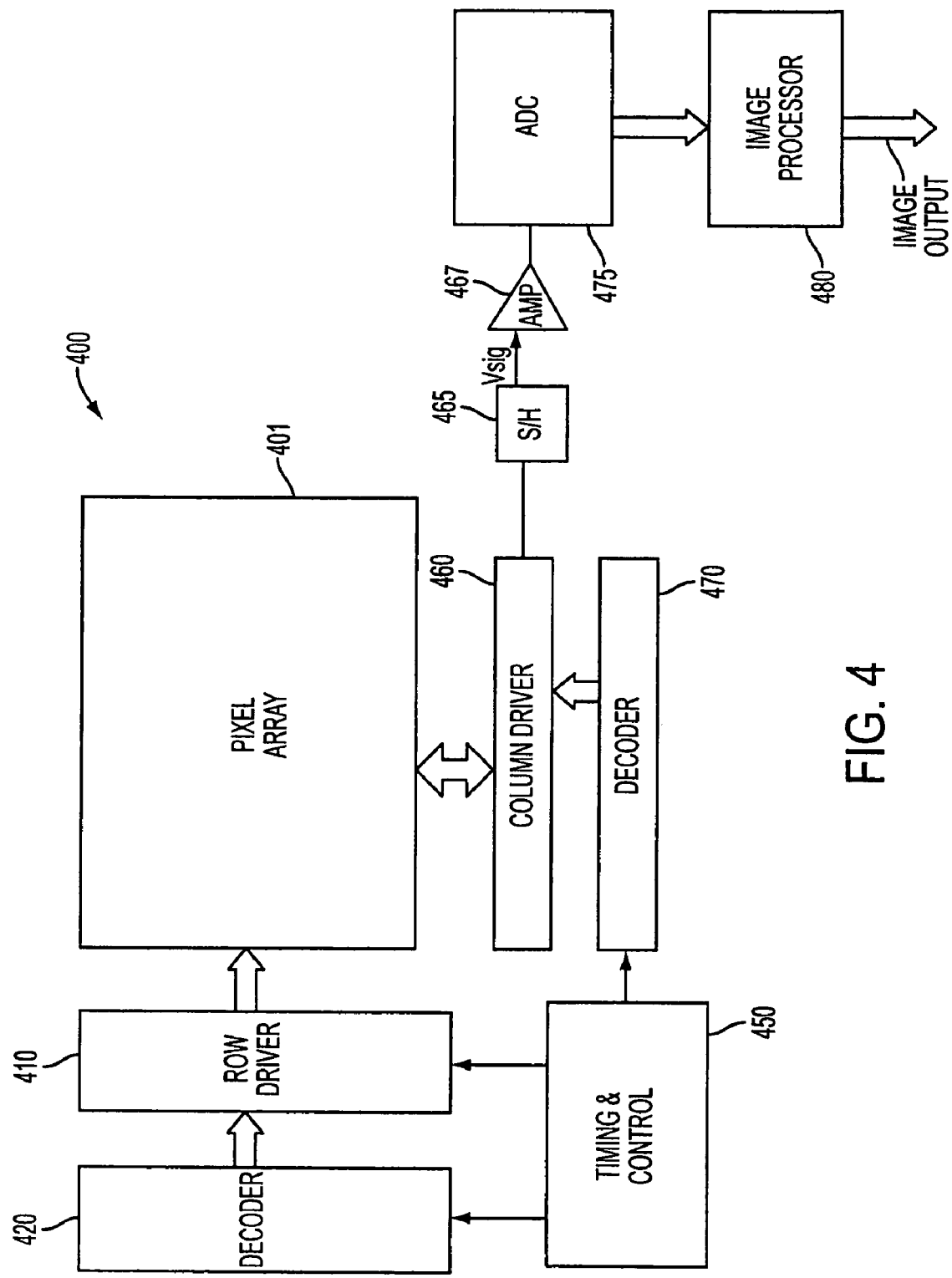
FIG. 4 illustrates a block diagram of an imager.

FIG. 4 illustrates a block diagram of a CMOS imager 400 having a pixel array 401. The CMOS imager 400 may implement the output driver circuits 200, 300 described above in several components of the imager 400 (e.g., output driver of the image processor 480). Pixel array 401 comprises a plurality of pixels arranged in a predetermined number of columns and rows. Attached to the array 401 is signal processing circuitry. The pixels of each row in array 401 can be simultaneously operated, and the pixels of each column are selectively output onto column lines by respective column select lines. A plurality of row and column select lines are provided for the entire array 401. The row lines are selectively activated by a row driver 410 in response to row address decoder 420. The column select lines are selectively activated by a column driver 460 in response to column address decoder 470. Thus, a row and column address is provided for each pixel.

The CMOS imager 400 is operated by the timing and control circuit 450, which controls address decoders 420, 470 for selecting the appropriate row and column lines for pixel readout. The control circuit 450 also controls the row and column driver circuitry 410, 460 such that these apply driving voltages to the drive transistors of the selected row and column lines. The pixel column signals, which typically include a pixel reset signal, and the pixel image signals are read by a sample and hold circuit 465 associated with the column drive 460. A signal is produced by amplifier 467 for each pixel. The signal is digitized by an analog-to-digital converter 475 (ADC). The analog-to-digital converter 475 supplies the digitized pixel signals to an image processor 480 which forms and outputs a digital image.

The circuits 200, 300 illustrated and described in FIGS. 2-3 maybe used in any application that requires an output driver, for example, these circuits can be used in the output driver of image processor 480 of FIG. 4. The circuits 200 and 300 are not limited to imager applications but maybe used in any application where a driver circuit having a slew rate which is less affected by power supply variations is needed.

Figure 5:
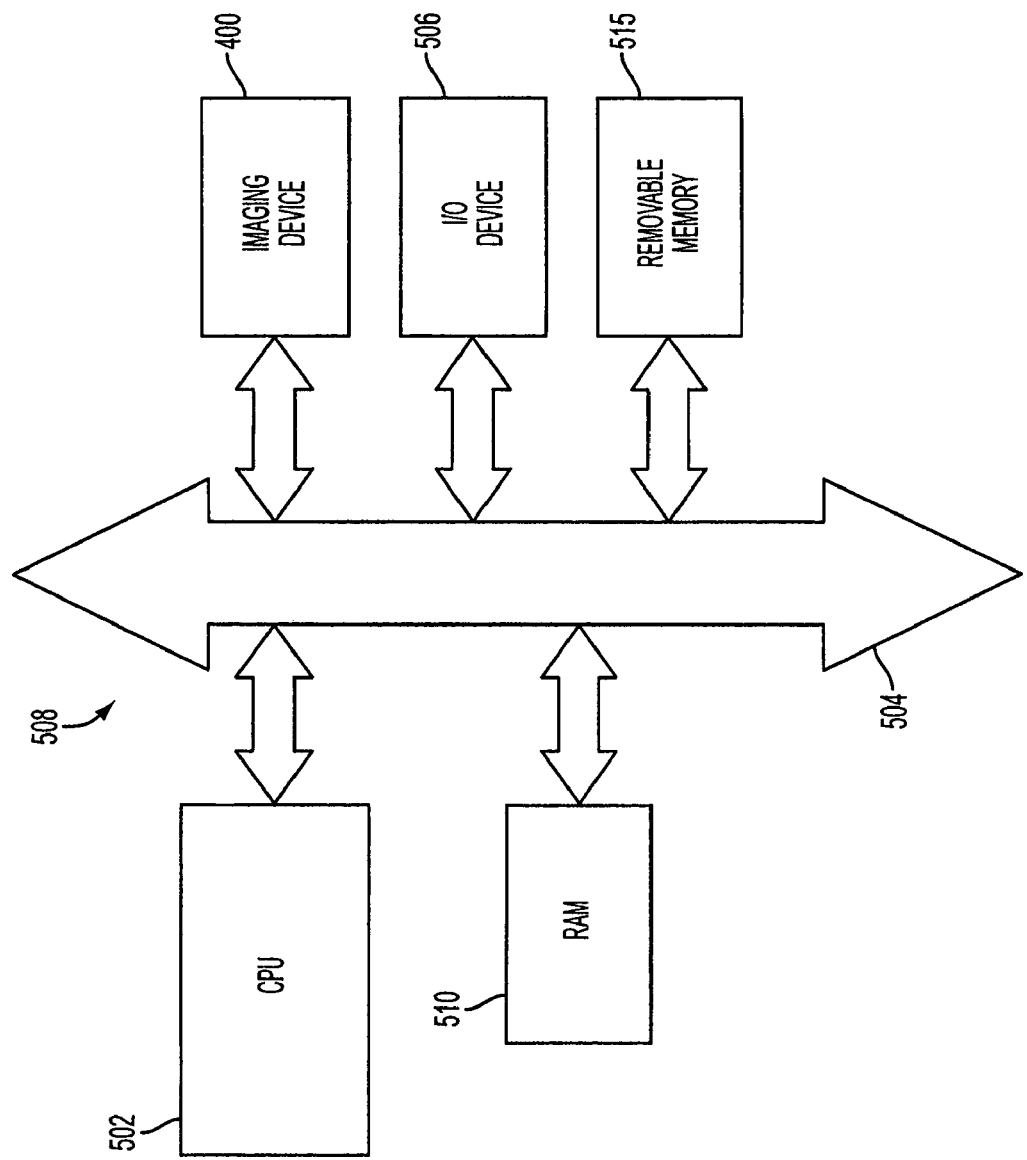
FIG. 5 illustrates a schematic diagram of a processing system employing an imager.

FIG. 5 shows system 508, which includes an imager 400 constructed in accordance with one or more of the embodiments herein. The system 508 may be part of a digital camera or other imaging system. The imager 400 may receive control or other data from system 508. System 508 includes a processor 502 having a central processing unit (CPU) for image processing, or other image handling operations. The processor 502 communicates with various devices over a bus 504. Some of the devices connected to the bus 504 provide communication into and out of the system 508; an input/output (I/O) device 506 and an imaging device, i.e., imager 500, are such communication devices. Other devices connected to the bus 504 provide memory, for instance, a random access memory (RAM) 510 or a removable memory 515.

While various embodiments have been described and illustrated above, it should be understood that these embodiments are not to be considered as limiting. Additions, deletions, substitutions, and other modifications can be made Accordingly, these embodiments are not to be considered as limited by the foregoing description but are only limited by the appended claims.

What is claimed as new and desired to be protected by Letters Patent of the United States is:

1. An output driver circuit comprising:
   a first circuit for driving a first output transistor, the first circuit including at least a current sensing resistor and a first switch connected in parallel;
   a second circuit for driving a second output transistor, the second output transistor being connected in series with the first output transistor;
   an output terminal formed at a connection between the serially connected first and second output transistors;
   a first power supply for supplying an operating voltage to said first circuit;
   a second power supply, different from the first power supply, for supplying power to said second circuit; and
   wherein the sensing resistor and the first switch are connected between the gate of the first output transistor and the first power supply and wherein the signal output of the output terminal is independent of an operating level variation associated with the first power supply.

2. The output driver circuit of claim 1, comprising:
   a current reference generating circuit connected to the first and second circuits, including a connection to the second power supply, for generating at least one constant current source to drive the first and second output transistors.

3. The output driver circuit of claim 1, said second circuit comprising a current limiting resistance connected to the second output transistor.

4. The output driver circuit of claim 1, wherein the output driver is configured for achieving an output drive and a constant slew rate for a given load that is not dependant on a variation of the power supply level of the first power supply.

5. An integrated circuit comprising: an output driver circuit, the output circuit further comprising: a first pair of power supply terminals for receiving a first supply voltage, a first circuit connected to the first pair of power supply terminals and comprising at least one first switch and a first resistance; a second pair of power supply terminals for receiving a second supply voltage, different from the first power supply voltage, a second circuit connected to the second pair of power supply terminal and comprising where at least one second switch and a second resistance; a pair of first and second output transistors, having an output node at an interconnection between the first and second output transistors, a gate of the first output transistor is connected to the first circuit and a gate of the second output transistor is connected to the second circuit; a third circuit comprising a constant current source and a third switch, the third circuit connected to the gate of the first output transistor; and an input terminal connected to the at least one first and second switches, wherein a signal output of the output driver circuit at said output node is not influenced by a variation by a voltage level of the first supply voltage.

6. The integrated circuit of claim 5, wherein the first circuit comprises at least two switches and a current sensing resistance connected to the gate of the first output transistor.

7. The integrated circuit of claim 5, wherein the second circuit comprises at least two switches and a current limiting resistance connected to the gate of the second output transistor.

8. The integrated circuit of claim 5, wherein the first constant current source is provided by a transistor.

9. The integrated circuit of claim 8, further comprising a fourth circuit comprising a second constant current source, the fourth circuit connected between the second resistance and a fourth switch.

10. The integrated circuit of claim 5, further comprising a current reference generating circuit.

11. The integrated circuit of claim 10, the current reference generating circuit further comprising second and third constant current sources, wherein the current reference generating circuit provides respective biases for the second and third constant current sources.

12. An output driver circuit comprising:
an output stage having a pair of n-channel and p-channel output transistors;
first and second circuits for, respectively, driving the n-channel and p-channel output transistors;
an output terminal formed at a connection between the connected p-channel and n-channel transistors; and
a current reference generator circuit for controlling the gate of at least one transistor providing at least one constant current source to drive the p-channel and n-channel transistors the current reference generator circuit including a plurality of transistors and at least one resistive element;
wherein the first circuit includes at least one resistor connected between a first voltage source and a node, the node being connected to a first switch connected to ground and the gate of the n-channel transistor.

13. The output driver circuit of claim 12, further comprising a first resistance for sensing the current on the gate of the p-channel transistor.

14. The output driver circuit of claim 12, wherein the output driver is configured to achieve an output drive and a constant slew rate for a given load which is not influenced by a variation in the level of power of a power supply.

15. An output driver circuit comprising:
first and second serially connected output transistors;
a first operating voltage terminal for supplying a first operating voltage to said serially connected output transistors;
a second operating voltage terminal for receiving a second operating voltage, different from the first operating voltage;
a control circuit responsive to an input signal for controlling operation of said output transistors, said control circuit including first and second circuits, having respective current sources, respectively connected to the gates of said first and second output transistors, one of said first and second control circuits receiving operating voltage from said first operating voltage terminal and the other from said first and second control circuits receiving operating voltage from second voltage terminal,
wherein the first control circuit includes at least a first switch and a first resistance connected in parallel, the first switch and the first resistance being connected to the first operating voltage terminal and a gate of one of the output transistors.

16. The output driver circuit of claim 15, wherein the first circuit and second circuits are configured to drive the first and second output transistors independent of the variation of one of said first or second operating voltages.

17. A method of operating an output driver comprising:
generating an output signal though an output stage of an output driver having at least a p-channel and n-channel output transistors serially connected;
applying an input signal to a plurality of switches, a first plurality of switches being connected to a first control circuit and a second plurality of switches being connect to a second control circuit;
operating the first control circuit, having a sensing resistor and a first switch of the first plurality of switches connected between a gate of the p-channel output transistor and a first voltage source, based on the input signal applied to the plurality of switches; and
operating the second control circuit, having at current limiting resistor connected between a second voltage source, different from the first voltage source, and a node, the node being connected to a first switch of the second plurality of switches, the first switch of the second plurality of switches connected to ground and the gate of the n-channel transistor, based on the input signal applied to the plurality of switches;
wherein the switches are on or off depending on the input voltage applied and the switches control the gate bias supplied to the n-channel and p-channel transistors independent of the variation of at least one supply voltage.

18. The method of claim 17, further comprising constant current sources each for providing current to a predetermined respective set of the plurality of switches of the first and second control circuits.

* * * * *

UNITED STATES PATENT AND TRADEMARK OFFICE
CERTIFICATE OF CORRECTION

PATENT NO. : 7,683,671 B2  Page 1 of 1
APPLICATION NO. : 11/512301
DATED : March 23, 2010
INVENTOR(S) : Yan Lee It is certified that error appears in the above-identified patent and that said Letters Patent is hereby corrected as shown below:

In column 7, lines 36-37, in Claim 12, delete "transistors" and insert -- transistors, --, therefor.

Signed and Sealed this

First Day of June, 2010

David J. Kappos
*Director of the United States Patent and Trademark Office*